US008242786B2

(12) United States Patent
Fuhrmann et al.

(10) Patent No.: US 8,242,786 B2
(45) Date of Patent: Aug. 14, 2012

(54) METHOD AND SYSTEM FOR PARTIAL DISCHARGE TESTING OF AN INSULATION COMPONENT

(75) Inventors: Henning Fuhrmann, Zürich (CH); Andrej Krivda, Wettingen (CH)

(73) Assignee: ABB Research Ltd, Zurich (CH)

( * ) Notice: Subject to any disclaimer, the term of this patent is extended or adjusted under 35 U.S.C. 154(b) by 430 days.

(21) Appl. No.: 12/543,780

(22) Filed: Aug. 19, 2009

(65) Prior Publication Data
US 2010/0045305 A1 Feb. 25, 2010

(30) Foreign Application Priority Data

Aug. 21, 2008 (EP) .................................. 08162742

(51) Int. Cl.
*G01R 31/02* (2006.01)
(52) U.S. Cl. ................. 324/536; 324/551; 324/557
(58) Field of Classification Search .............. 324/536, 324/541, 544, 551, 557, 527
See application file for complete search history.

(56) References Cited

OTHER PUBLICATIONS

Filho V. Swinka et al., "Imaging of voids in dielectric materials by x-ray induced partial discharge", Review of Scientific Instrutments, AIP, Mar. 1, 2002, pp. 1288-1292, vol. 73, No. 3, 2002 American Institute of Physics, Melville, New York, USA.
Rizzetto S. et al, A system for the detection and location of partial discharges using x-rays, Conference Record of the 1988 IEEE International Symposium on Electrical Insulation, Jun. 5-8, 1988, pp. 262-266, Boston, Massachusetts, USA.
G.C. Dasilva et al, "Study of Continuous and Pulsed x-ray induced partial discharge statistical behaviour in epoxy samples", Proceedings of the 7th International Conference on Properties and Applications of Dielectric Materials, Jun. 1-5, 2003, pp. 831-834, vol. 3, Nagoya, Japan.
G.C. Silva et al., "Continuous and pulsed x-ray induced partial discharges: similarities and differences", 2006 Annual Report Conference on Electrical Insulation and Dielectric Phenomena, Oct. 1, 2006, pp. 598-601.

*Primary Examiner* — Vincent Q Nguyen
(74) *Attorney, Agent, or Firm* — Buchanan Ingersoll & Rooney PC

(57) ABSTRACT

The disclosure relates to a method for partial discharge testing of an insulation component, wherein at least one X-ray pulse is applied to the insulation component, an AC voltage is applied to the insulation component and the partial discharge induced by the at least one X-ray pulse is measured, wherein the dose rate of the at least one X-ray pulse is at least about $10^{-2}$ Gray/s. The disclosure relates further to a system for partial discharge testing of an insulation component which includes a flash X-ray source for generating at least one X-ray pulse, an AC voltage source, a voltage sensor, a partial discharge sensor and a partial discharge detection device for evaluating the measured partial discharge.

20 Claims, 4 Drawing Sheets

METHOD AND SYSTEM FOR PARTIAL DISCHARGE TESTING OF AN INSULATION COMPONENT

RELATED APPLICATION

This application claims priority under 35 U.S.C. §119 to European Patent Application No. 08162742.4 filed in Europe on Aug. 21, 2008, the entire content of which is hereby incorporated by reference in its entirety.

FIELD

The disclosure relates to a method and system for partial discharge testing of an insulation component. The insulation component can, for example, include (e.g., consist of) solid dielectric material, such as filled epoxy resin, but is not limited to being solid.

BACKGROUND INFORMATION

Insulation components are used in high voltage electrical equipment, such as for example capacitors, transformers or switchgear barriers. Dielectrics of the insulation component can, however, exhibit regions of high electric field intensity which may cause partial discharges that are characterized in that they do not completely bridge the electrodes.

The partial discharges quite often start, for example, within inhomogeneities such as voids or cracks within a solid insulation component or bubbles within a liquid insulation component. For simplicity of presentation the inhomogeneities are referred to herein as "voids". The voids can be gas-filled. If the voltage stress across a void exceeds the inception voltage for the gas within the void, the gas ionizes and partial discharges can start to occur within the void. The partial discharges can then cause progressive deterioration of the material of the insulation component which ultimately might lead to an electrical breakdown of the insulation component.

To avoid deterioration and electrical breakdown in the field and to control the quality of an insulation component, an insulation component can be tested for voids by a partial discharge test before leaving the factory. Such a known partial discharge test can include applications of a high AC overvoltage for a limited duration on the order of a minute combined with partial discharge measurements (in the following called the known partial discharge test).

For a partial discharge to occur—in addition to the voltage stress across the void exceeding the inception voltage—there should be enough free electrons within or at the void to initiate an electron avalanche within the void and hence a partial discharge. A free electron may also be called start electron. In a virgin insulation component the most likely event to cause such a free electron is background radiation. Another mechanism for the creation of start electrons is field emission from the void surface.

This means, that even in the case of voids being present, they may not be detected due to a lack of free electrons in or at the void or due to a statistical time lag, being the time required for a free electron to appear in the void. The time for such a free electron to appear within a void can increase with a decrease in void size. In particular, small voids may not develop partial discharge activity within the duration of the known partial discharge test and therefore may not be detected. Known partial discharge tests often use very high AC voltages, which leads to field emission from the void surface, to force also the small voids into discharge. However, using such high AC voltage may cause irreversible damage by initiating electrical trees from other stressed enhancing defects, such as inclusions of metallic particles which might have been harmless at operating stress.

To provide the initiatory free electrons it is known to expose the insulation component to ionizing radiation, e.g. X-ray irradiation, concurrently to the application of the AC voltage and the measuring of the partial discharge activity. The exposure to a continuous X-ray beam has been described in "Partial Discharge—Part XV: Improved PD Testing of Solid Dielectrics using X-ray Induced Discharge Initiation", N. Fujimoto et al., IEEE Electrical Insulation Magazine, Vol. 8, No. 6, 1992, pp. 33-41, "Modulation of Partial Discharge Activity in GIS Insulators by X-ray Irradiation" by J. M. Braun et al., IEEE Transactions on Electrical Insulation, Vol. 26, No. 3, June 1991, pp. 460-468, "X-ray Induced Partial Discharge—an Application for High Voltage Insulation Diagnostics" by L. S. Pritchard et al., Proceedings of the IEE Colloquium on Materials Characterisation—How Can We Do It? What Can It Tell Us? (Ref. No: 1997/150), December 1997, pp. 7/1-7/3, "Location of Partial Discharges in High Voltage Equipment Using Ionizing Rays" by J. Svitek, Proceedings of the $5^{th}$ International Conference on Dielectric Materials, Measurements and Applications, June 1988, pp. 183-186). With the provision of free electrons by X-ray irradiation, the time lag/delay before partial discharge initiation can be reduced. Furthermore, the inception voltage can be reduced to a value which is considered to be much closer to the true value inherent to the properties of the insulation component and the defect type (i.e. void type).

Further, it has been proposed to expose the insulation component to a pulsed X-ray irradiation ("Study of Continuous and Pulse X-ray Induced Partial Discharge Statistical Behaviour in Epoxy Samples" by G. C. da Silva et al., Proceedings of the $7^{th}$ International Conference on Properties and Applications of Dielectric Materials, June 2003, Session S7-1, pp. 831-834, "Continuous and Pulsed X-ray Induced Partial Discharges: Similarities and Differences" by G. S. Silva at al., 2006 Annual Report Conference on Electrical Insulation and Dielectric Phenomena, pp. 598-601). In this case, an X-ray tube is used for generating a continuous X-ray beam. For the generation of pulsed X-ray beams a chopper is inserted between the X-ray tube and the insulation component. The chopper includes a lead disk with two rectangular windows operated by an AC motor. The length/duration of the such obtained X-ray pulses is approximately 2 ms per cycle. With a combination of an X-ray tube with a chopper, X-ray pulses with a shorter pulse length can generally not be obtained.

When pulsed X-ray irradiation is used, the partial discharges occur only during the interval of X-ray pulse application. Hence, the partial discharges are modulated by the X-ray pulses.

With the application of continuous X-ray irradiation or pulsed X-ray irradiation with a pulse length of 2 ms or higher the magnitude of the induced partial discharge pulses may, however, be considerably lowered, such that a precision, low noise partial discharge detection equipment may be required for detection of the partial discharge pulses. Such high precision, low noise partial discharge detection equipment is, however, not suitable for usage in a factory environment.

SUMMARY

A method for partial discharge testing of an insulation component is disclosed, comprising: a) applying an AC voltage to an insulation component; b) applying at least one X-ray pulse to the insulation component; and c) measuring the partial discharge induced by the at least one X-ray pulse; wherein a dose rate of the at least one X-ray pulse inside the insulated component is at least $10^{-2}$ Gray/s.

A system for partial discharge testing of an insulation component is disclosed, comprising: an X-ray source for generating at least one X-ray pulse; an AC voltage source; a voltage sensor; a partial discharge sensor; and a partial discharge detection apparatus for evaluating a measured partial discharge, wherein the X-ray source is a flash X-ray source.

BRIEF DESCRIPTION OF THE DRAWINGS

Further advantageous features and applications of the disclosure can be found in the dependent claims as well as in the following description of the drawings illustrating the disclosure. In the drawings like reference signs designate the same or similar parts throughout the several features of which:

Figure 2:
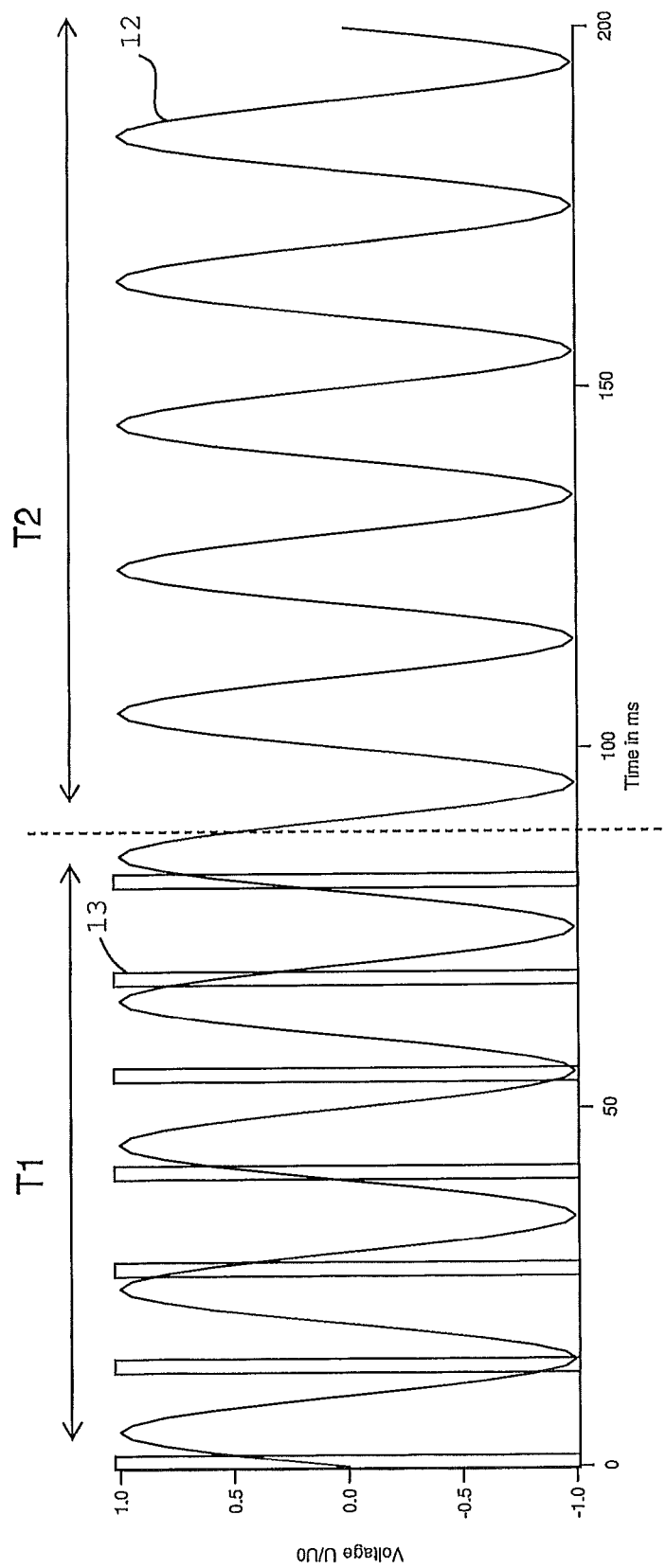
FIG. 2 shows exemplary time curves of the AC voltage and the X-ray pulses applied to an insulation component according to a first exemplary method of the disclosure.
Figure 3:
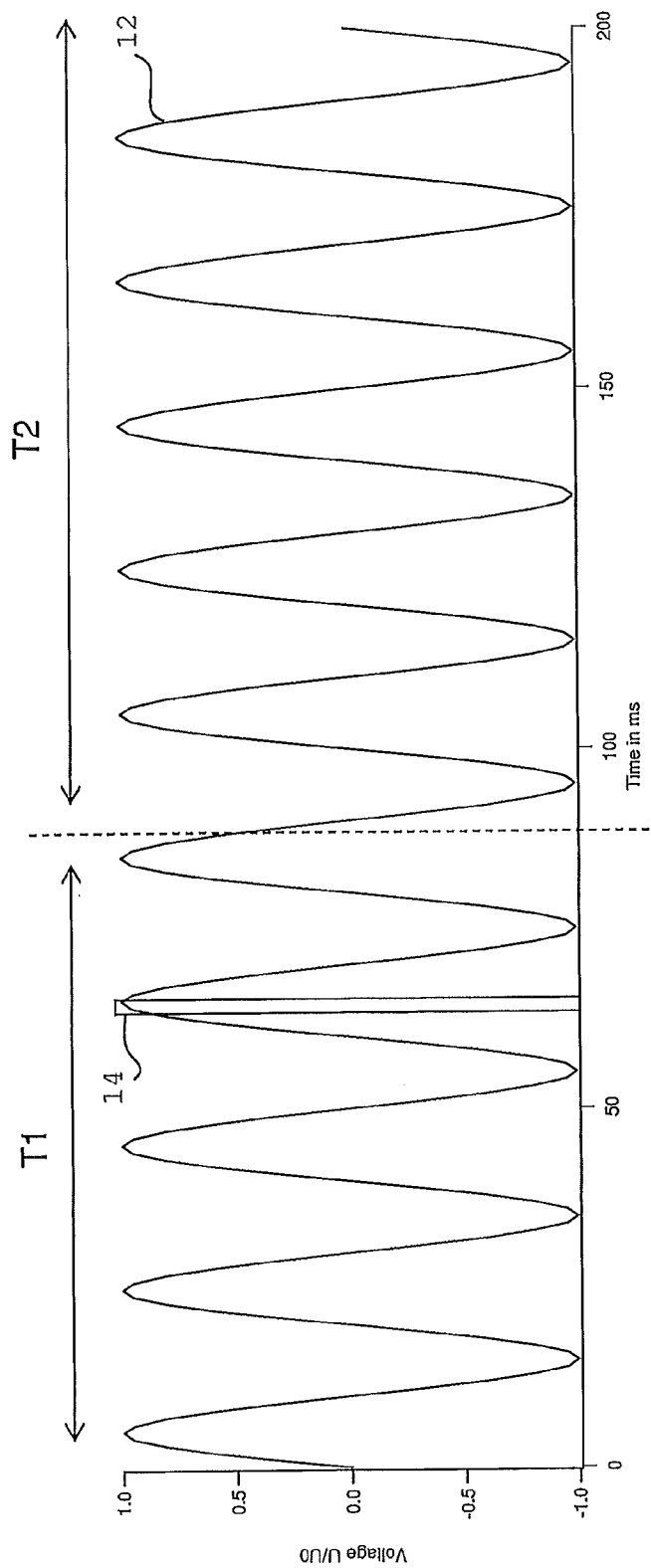
FIG. 3 shows exemplary time curves of the AC voltage and the X-ray pulses applied to an insulation component according to a second exemplary method of the disclosure.

The values given in FIGS. 2 and 3 are only exemplarily.

DETAILED DESCRIPTION

A method and a system are disclosed for partial discharge testing of an insulation component by which voids of the insulation component can be easily detected. An exemplary method and a system for partial discharge testing of an insulation component are provided by which the inception voltage of the partial discharges can be lowered while the dynamic behaviour of the partial discharges (and of the electron avalanches within the void causing the partial discharge) basically remains preserved when compared to the known tests and systems without radiation.

In an exemplary method for partial discharge testing of an insulation component, an AC voltage is applied to the insulation component and at least one X-ray pulse with a radiation dose rate of equal to or more than about (e.g., plus or minus 10%) $10^{-2}$ Gray/s (10 mGray/s), and, for example, of a duration of less than about 1 ms, is applied to the insulation component and the partial discharge induced by the at least one X-ray pulse is measured. When a partial discharge, for example a partial discharge pulse, of a particular, pre-defined magnitude is measured, then it can be concluded that the insulation component comprises a void or voids, respectively.

By using X-ray irradiation, free electrons can be generated within a void of the insulation component and the inception voltage can be lowered. In particular the inception voltage can be significantly lowered by, for example, a factor of about 2 to 5, or lesser or greater.

If the insulation component is only exposed to X-ray pulses with a dose rate of more than about $10^{-2}$ Gray/s and with, for example, a duration of less than about 1 ms, many more than one free electrons can be created within a technically relevant, basically spherical void with a diameter of more than 100 µm. The time interval of 1 ms corresponds to the time that is used for recombination of free electrons with ions inside the voids filled with one or more gases relevant for high voltage insulation (e.g. air, nitrogen, sulphur hexafluoride ($SF_6$)). Consequently, after the end/dying out of the X-ray pulse, the generated many free electrons recombine with the ions on the time scale of milliseconds, which means that even after a time period of some milliseconds the probability to find at least one free electron located close to the cathode of the void (void cathode) is high. The cathode of the void is defined as the void surface in the direction of the electric field in the void.

Hence, for example, the duration of the at least one X-ray pulse corresponds to the recombination time of free electrons and ions inside a void filled with one or more gases. If the inherent inception voltage of the void is exceeded by the impressed voltage during this time period of some milliseconds following the X-ray pulse and a number of free electrons remain, which are located close to the void cathode, a partial discharge occurs. Then the dynamic behavior of the partial discharge is close to the dynamic behavior of a partial discharge without X-ray radiation. The partial discharge deposits charge on the void surface, which has a magnitude and distribution close to the magnitude and distribution of a partial discharge without X-ray application. It follows that partial discharges, which are triggered by start electrons emitted from the charged surface, establish a partial discharge pattern which is close to the partial discharges pattern generated when no X-ray irradiation is applied.

If the X-ray pulse is applied while the impressed voltage across the void already exceeds the inception voltage, the partial discharge triggers instantly. However in this case, the dynamic behaviour of the partial discharges occurring during irradiation is different from the natural dynamic behaviour of a partial discharge (where no X-ray irradiation is applied), owing to the presence of additional free electrons and ions. This alters the resulting void surface charge, and may also influence the characteristics of following partial discharges. It is therefore beneficial to work with even shorter pulses.

If the insulation component is only exposed to X-ray pulses with duration of less than 100 ns and the dose rate is, for example, more than about 100 Gray/s, many more than one, for example about 100, free electrons are created within a technically relevant, basically spherical void of more than 100 µm in diameter. The time interval of 100 ns corresponds to the duration of a single partial discharge event in gases relevant for high voltage insulation (e.g. air, nitrogen, $SF_6$). This means that already the first partial discharge event exhibits a dynamic behavior that is very close to the dynamic behavior of a natural partial discharge (i.e. where no X-ray irradiation is applied). The resulting surface charge consequently corresponds to the surface charge of a natural partial discharge (i.e. where no X-ray irradiation is applied), and following partial discharges are also natural partial discharges.

The generated partial discharges hence being natural partial discharges can have an the advantage that the employed partial discharge equipment or apparatus can be of lower precision and can work with less noise reduction than devices that are used for partial discharge detection under permanent X-ray irradiation. On the other hand even smaller voids can be detected if a given device with its inherent noise reduction is employed. It is another exemplary advantage that well established rules can be used for interpretation of the results.

In contrast to the exemplary method according to the disclosure, permanent X-ray irradiation with the above-mentioned dose rates can lead to a highly ionized, conductive void in which no partial discharges can occur. Known permanent irradiation with lower dose rates, as reported in literature (e.g., $5 \cdot 10^{-6}$ to $2 \cdot 10^{-4}$ Gray/s), can lead to the occasional occurrence of single free electrons in the void, many of which are, however, not as close to the void cathode as required. As there are only few free electrons close to the cathode, the probability is very small that free electrons are still present after the recombination time of about 1 ms. Hence, the overall probability of detecting a void by obtaining appropriate partial discharge measurements is rather small.

The partial discharge caused by a single free electron, especially in a small void (e.g., with a diameter <1 mm) may be very small, such that the resulting charge on the void surface may not be sufficient to lead to sustained partial discharges in the next voltage cycles.

The X-ray dose rate at the void location can be estimated by the following known absorption law for X-rays. Along the X-ray beam in z-direction (the z-direction being the beam direction), the initial dose rate $I_0$, given by the X-ray source characteristics, is reduced according to the absorption law to $$I(z)=I_0 \cdot \exp(-\mu z)$$

where $\mu$ is the X-ray mass attenuation coefficient which depends on the material of the insulation component and the X-ray energy. Values for $\mu$ are tabulated for most technically relevant materials and X-ray energies, and can be found e.g. in the "CRC Handbook of Chemistry and Physics, 75th Edition", ISBN 0-8493-0475-X.

An exemplary system of the disclosure for partial discharge testing of an insulation component according to an exemplary method of the disclosure comprises an AC voltage source for generating the AC voltage to be applied to an insulation component, a voltage sensor for measuring the applied AC voltage, a partial discharge sensor for measuring induced partial discharges, a partial discharge detection apparatus for evaluating the measured partial discharges and a flash X-ray source. With the flash X-ray source X-ray pulses with a length of less than about 1 ms, for example, with a length of basically about 100 ns, can be generated.

Figure 1:
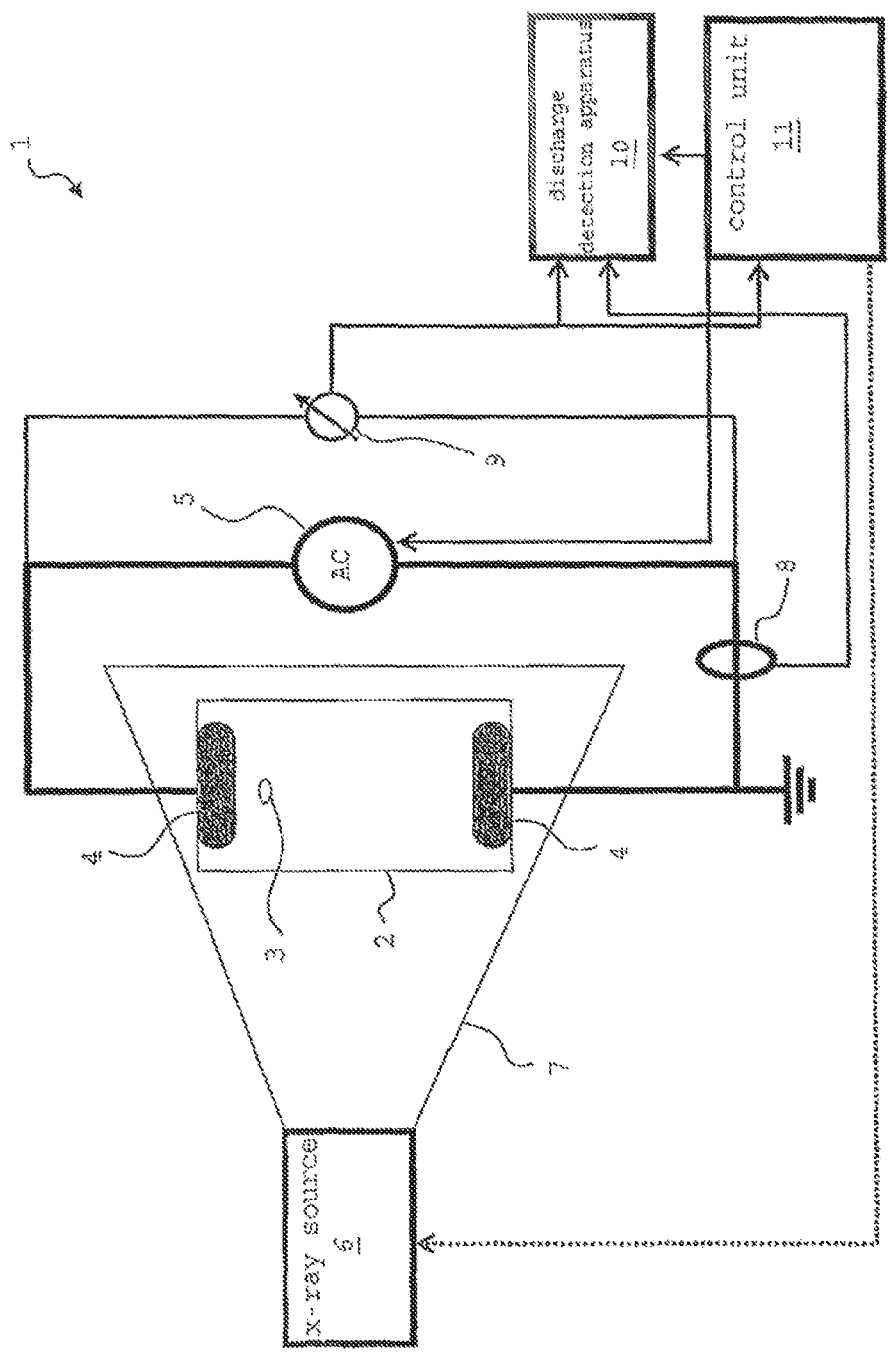
FIG. 1 shows a schematic drawing of a first exemplary embodiment of a system according to the disclosure.

FIG. 1 depicts a first exemplary embodiment 1 of a system for partial discharge testing of an insulation component 2 according to the disclosure. The insulation component 2 has a defect in that it has a void 3. The void 3 has for example a diameter on the order of 0.5 mm. The insulation component 2 is placed between two electrodes 4 which are connected to an AC voltage source 5. By means of the AC voltage source 5 the insulation component 2 can be stressed with an AC voltage. In an exemplary embodiment, the AC voltage can, for example, have a frequency of about 50 Hertz or 60 Hertz and an amplitude of about 500 kV. Furthermore, a flash X-ray source 6 is provided for generation of at least one X-ray pulse 7 formed as of an X-ray radiation cone. The flash X-ray source 6 does not require a chopper. The flash X-ray source 6 is positioned such that its X-ray pulse 7 impinges onto the insulation component 2, whereby the insulation component 2 is, for example, entirely located within the radiation cone. A flash X-ray source 6 may, for example, be capable of generating 100 X-ray pulses with a repetition frequency of 15 Hz.

In the electrical path from one of the electrodes 4, for example from the electrode 4 that is connected to ground, to the AC voltage source 5 a partial discharge sensor 8 is provided for detecting and measuring partial discharges which might occur in the void 3. For example, a partial discharge sensor 8 detects and measures a partial discharge by measuring derivative(s) of the current and/or by determining the area under a transient current pulse caused by the partial discharge, i.e. by integrating the transient current pulse. Furthermore, a voltage sensor 9 is provided for measuring the actual voltage impressed on the insulation component 2.

Figure 4:
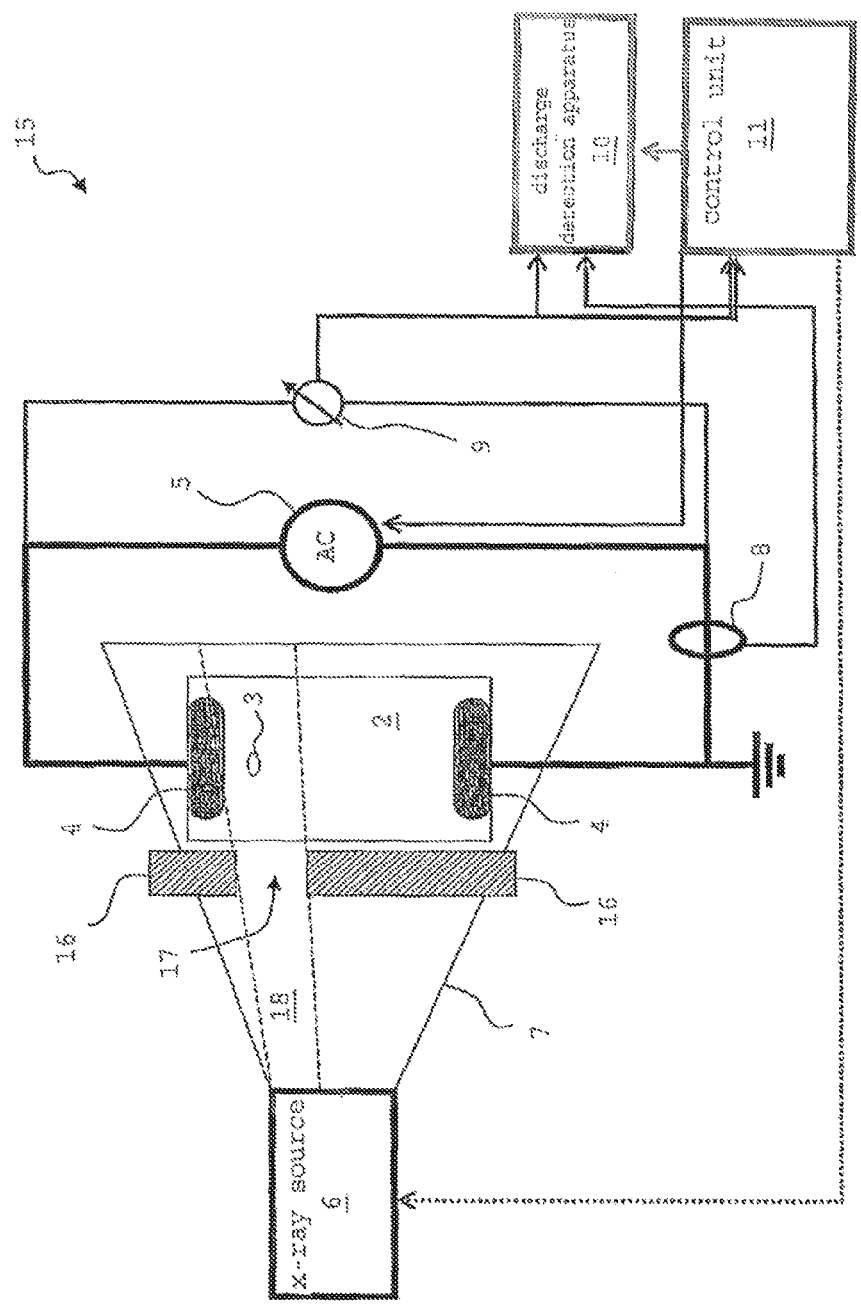
FIG. 4 shows a schematic drawing of a second exemplary embodiment of a system according to the disclosure.

The partial discharge sensor 8 can detect partial discharges by, for example, measuring current pulses (and can therefore comprise a current sensor), or by measuring voltage pulses across a test impedance connected either in series or in parallel to the test object (here: the insulation component). Other methods include acoustic detection with ultrasound microphones, optical sensors, and/or antennae, although any suitable known method can be used. In FIGS. 1 and 4 the partial discharge sensor 8 is exemplarily formed as a current sensor.

The partial discharge measured by the partial discharge sensor 8 is then evaluated with respect to the AC voltage measured by the voltage sensor 9 by the partial discharge detection apparatus 10, which can have a display for depicting time curves of the applied AC voltage, the measured voltage and/or the measured partial discharge.

A control unit 11 can be provided by which the AC voltage source 5, the flash X-ray source 6 and/or the partial discharge detection apparatus 10 can be controlled, for example, depending on the applied AC voltage.

For free electrons to be generated in the void 3 it is sufficient that the flash X-ray source 6 generates one X-ray pulse with a length of less than about 1 ms, with, for example, a length of approximately 100 ns. The radiation dose rate is for example 200 Gray/s. To ensure that partial discharges occur in the void 3 the applied AC voltage should be above the inception voltage. Therefore, the one or more X-ray pulses are, for example, applied basically at those time instances when the modulus of the applied AC voltage reaches a value which lies above the inception voltage.

To ensure that X-ray pulses are actually applied when the value of the AC voltage is close to its maximum, for example, at least 90 percent of the maximum, either enough X-ray pulses have to be applied in case of the cycle time of the AC voltage differing from the cycle time of the X-ray pulses, i.e. the AC voltage and the sequence of X-ray pulses being asynchronous. This is by way of example depicted in FIG. 2.

FIG. 2 shows exemplary time curves of an applied AC voltage 12 and applied X-ray pulses 13. For this example seven X-ray pulses 13 are shown. Of course, more or less X-ray pulses 13 can be applied. In the shown example the second X-ray pulse 13 after the origin of the coordinate system lies close enough to the maximum of the modulus of the AC voltage 12, so that the inception voltage has been reached or is even exceeded by the AC voltage. Information on the X-ray pulse 13 that lies close enough to the maximum can be obtained by comparing the repetition frequency/cycle time of the X-ray pulses with the cycle time of the AC voltage.

Another way to ensure that an X-ray pulse is applied when the value of the AC voltage reaches its maximum or is close to its maximum (e.g. being about 90 percent of its maximum) is to control the flash X-ray source 6 such with the control unit 11 that the flash X-ray source 6 emits an X-ray pulse 7 at a time instance that corresponds to a certain measured value of the applied AC voltage, in particular its maximum or a value in the range of e.g. 90 percent of its maximum. The measured value of the AC voltage is obtained from the voltage sensor 9. The voltage sensor 9 feeds the measured value(s) of the AC voltage to the control unit 11 and to the partial discharge detection apparatus 10. The control unit 11 compares the measured value of the AC voltage to a pre-defined value, for example a maximum of the applied AC voltage or 90 percent thereof. If the measured voltage of the AC voltage corresponds to or exceeds the pre-defined value, then the control unit 11 triggers the flash X-ray source 6 to emit an X-ray pulse 7. The dotted arrow depicted in FIG. 1 represents the control path from the control unit 11 to the flash X-ray source 6.

FIG. 3 shows an X-ray pulse 14 generated according to the above described exemplary method of the disclosure, wherein the control unit 11 triggers the flash X-ray source 6 at a certain time instance corresponding to a certain value of the AC voltage 12, which in this case is slightly less than the maximum of the AC voltage 12, as the trailing edge of the X-ray pulse 14 basically occurs at the same time instance as the maximum of the AC voltage 12. If appropriate, more than one X-ray pulse 14 can be generated in this manner.

The measuring/acquisition of the partial discharges occurs, for example, after the application of the one or more X-ray pulses 7 has ended, i.e. after the last X-ray pulse 7 died out. This is depicted by way of example in FIGS. 2 and 3. During a first period T1 of the AC voltage 12 the one or more X-ray pulses 13, 14 are applied to the insulation component 2 concurrently with the AC voltage 12. No partial discharge measurements are taken. During a period T2 no more X-ray pulses 13, 14 are applied and now measurements of the partial discharges induced by the X-ray pulses 13, 14 are taken by the partial discharge sensor 8. This can have an advantage that no more X-ray pulses 7 are generated than actually desired to start the partial discharge. Furthermore, the amplitude of the partial discharges will not be changed as might be the case if X-ray pulses are applied during measuring.

If measurements of the partial discharges shall be taken at the same time as the emission of the X-ray pulses 7, then the partial discharge sensor 8 should be shielded from the flash X-ray source 6, as the X-ray pulse generation may interfere with the measuring, thereby falsifying the measurements. On the other hand if the measurements of the partial discharges are, for example, first taken after the X-ray pulse generation and application has ended, shielding of the partial discharge sensor 8 from the flash X-ray source 6 can be reduced or eliminated.

When several X-ray pulses are applied, each X-ray pulse may be applied at a time instance corresponding to a different value of the AC voltage, wherein the different values of the AC voltage are either increasing or decreasing in time. Starting e.g. from the zero-crossing of the AC voltage and continuing to its maximum, the control unit 11 may trigger the flash X-ray source 6 at different, increasing time instances corresponding to different, increasing values of the AC voltage. The time instances may be equidistant. In such a way the inception voltage can be found when a fixed AC voltage is used, as the partial discharge sensor 8 can first detect a partial discharge, when the applied AC voltage is equal to or exceeds the inception voltage. I.e. once a partial discharge is detected by the partial discharge sensor 8, this means that the latest X-ray pulse has been applied concurrently to a value of the AC voltage that is equal to or exceeds the inception voltage.

Of course, the inception voltage may also be found by successively increasing the AC voltage or its amplitude while applying at least one X-ray pulse.

FIG. 4 shows a further exemplary embodiment 15 of the system according to the disclosure. The embodiment 15 corresponds to the embodiment 1 depicted in FIG. 1 but additionally comprises an aperture 16 that is positioned in the radiation path of the flash X-ray source 6, i.e. that is positioned between the flash X-ray source 6 and the insulation component 2. The aperture area 17 of the aperture 16 and/or its position can be altered in particular in a direction perpendicular to the direction of radiation of the flash X-ray source 6. By opening or closing the aperture 16, i.e. increasing or decreasing the aperture area 17, a wider or narrower X-ray pulse beam/cone can radiate the insulation component 2. I.e. by decreasing the aperture area 17 only a partial cone 18 of the X-ray pulse radiates the insulation component 2 leading to a higher resolution.

By narrowing the X-ray pulse beam and moving the aperture 16 in a direction perpendicular to the radiation, while emitting several, consecutive X-ray pulses between movements, different locations of the insulation component 2 can be irradiated by a (partial) X-ray pulse 18 in order to spatially locate a void 3 in the insulation component 2 and, hence, to determine the locations of the voids 3 within the insulation component 2 with spatial resolution. By appropriately adjusting the aperture area 17 and moving the aperture 16 such that the X-ray pulse 18 radiates different locations of the insulation component 2, the insulation component 2 can such be scanned for voids 3.

Of course, the certain aspects described with respect to FIGS. 1 to 4 can be combined with each other.

It is to be understood that while certain embodiments of the present disclosure have been illustrated and described herein, it is not to be limited to the specific embodiments described and shown.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE NUMERALS

1: embodiment of the system of the disclosure
2: insulation component
3: void
4: electrode
5: AC voltage source
6: flash X-ray source
7: X-ray pulse
8: partial discharge sensor
9: voltage sensor
10: partial discharge detection equipment
11: control unit
12: AC voltage time curve
13: X-ray pulse time curve
14: X-ray pulse time curve
15: embodiment of the system of the disclosure
16: aperture
17: aperture area
18: partial X-ray pulse

What is claimed is:

1. Method for partial discharge testing of an insulation component, comprising:
   a) applying an AC voltage to an insulation component;
   b) applying at least one X-ray pulse to the insulation component; and
   c) measuring the partial discharge induced by the at least one X-ray pulse; wherein a dose rate of the at least one X-ray pulse inside the insulated component is at least $10^{-2}$ Gray/s.

2. Method according to claim 1, wherein the dose rate of the at least one X-ray pulse in the insulated component is about 100 Gray/s.

3. Method according to claim 2, wherein the duration of the at least one X-ray pulse corresponds to a recombination time of free electrons and ions inside a void filled with one or more gases.

4. Method according to claim 3, wherein the duration of the at least one X-ray pulse is less than 1 ms.

5. Method according to claim 4, wherein the duration of the at least one X-ray pulse is less than 100 ns.

6. Method according to claim 4, wherein the partial discharge induced by the at least one X-ray pulse is measured after application of the at least one X-ray pulse has ended.

7. Method according to claim 1, wherein a length of the at least one X-ray pulse corresponds to a life time of a partial discharge.

8. Method according to claim 1, wherein the partial discharge induced by the at least one X-ray pulse is measured after application of the at least one X-ray pulse has ended.

9. Method according to claim 8, wherein the at least one X-ray pulse is applied at about a predefined modulus of the AC voltage.

10. Method according to claim 1, wherein the at least one X-ray pulse is applied at about a predefined modulus of the AC voltage.

11. Method according to claim 7, wherein the AC voltage is measured by a voltage sensor that supplies a measured value of the AC voltage to a control unit and wherein the control unit triggers a flash X-ray source to generate the X-ray pulse when the measured value of the AC voltage reaches a pre-defined value.

12. Method according to claim 1, wherein several X-ray pulses are applied, each X-ray pulse being applied at a different value of the AC voltage corresponding to a different time instance, wherein different values of the AC voltage are increasing or decreasing over time.

13. Method according to claim 1, wherein several X-ray pulses are applied at different locations of the insulation component.

14. Method according to claim 1, wherein the duration of the at least one X-ray pulse corresponds to a recombination time of free electrons and ions inside a void filled with one or more gases.

15. System for partial discharge testing of an insulation component, comprising:
   an X-ray source for generating at least one X-ray pulse;
   an AC voltage source; a voltage sensor;
   a partial discharge sensor; and
   a partial discharge detection apparatus for evaluating a measured partial discharge, wherein the X-ray source is a flash X-ray source.

16. System according to claim 15, wherein the X-ray source is configured for producing a dose rate of the at least one X-ray pulse of at least $10^{-2}$ Gray/s inside an insulation component to be tested.

17. System according to claim 16, comprising: a control unit is provided that is constructed such that it triggers the flash X-ray source to generate an X-ray pulse, when a value of the AC voltage measured by the voltage sensor reaches a pre-defined value.

18. System according to claim 17, wherein the flash X-ray source comprises:
   an aperture whose position and/or aperture area is altered.

19. System according to claim 15, comprising: a control unit is provided that is constructed such that it triggers the flash X-ray source to generate an X-ray pulse, when a value of the AC voltage measured by the voltage sensor reaches a pre-defined value.

20. System according to claim 15, wherein the flash X-ray source comprises:
   an aperture whose position and/or aperture area is altered.

* * * * *